United States Patent [19]

Janssens et al.

[11] Patent Number: 4,458,002
[45] Date of Patent: Jul. 3, 1984

[54] METHOD AND MATERIALS FOR IMPROVING THE COLOR BALANCE OF PHOTOGRAPHIC MULTICOLOR IMAGES USING CONTACT SCREEN

[75] Inventors: Wilhelmus Janssens, Aarschot; Christiaan G. Thiers, Schoten; Wilfried F. Liekens, Brasschaat, all of Belgium

[73] Assignee: AGFA-Gevaert, N.V., Mortsel, Belgium

[21] Appl. No.: 495,254

[22] Filed: May 17, 1983

[30] Foreign Application Priority Data

Jun. 30, 1982 [GB] United Kingdom ............... 82/8933

[51] Int. Cl.$^3$ .......................... G03C 7/00; G03C 7/04; G03B 27/72
[52] U.S. Cl. ........................................ 430/236; 430/7; 430/220; 430/359; 430/379; 430/383; 430/391; 355/35; 355/88
[58] Field of Search ............... 430/236, 220, 359, 383, 430/391, 396, 7, 511, 379; 355/35, 88

[56] References Cited

U.S. PATENT DOCUMENTS 2,252,006  8/1941  Holst et al. ........................... 430/140
4,272,186  6/1981  Plummer ................................ 355/38

OTHER PUBLICATIONS

"Optical Method for Curve Shape Control", Gilmour, *Research Disclosure* No. 17533, 11/1978, p. 17.

"Contrast Control . . . ", Meyerhoefer et al., *Research Disclosure* No. 18276, 6/1979, pp. 332 & 333.

*Primary Examiner*—Richard L. Schilling
*Attorney, Agent, or Firm*—A. W. Breiner

[57] ABSTRACT

A process for the production of a multicolor reversal image with improved color balance is provided which process comprises the steps of directing incident image light dot- or linewise modulated by a light-distributing means onto a multicolor photographic silver halide emulsion material containing a blue-, a green- and a red-sensitive silver halide emulsion layer and processing said silver halide emulsion layers to form a color reversal image.

Figure 1:
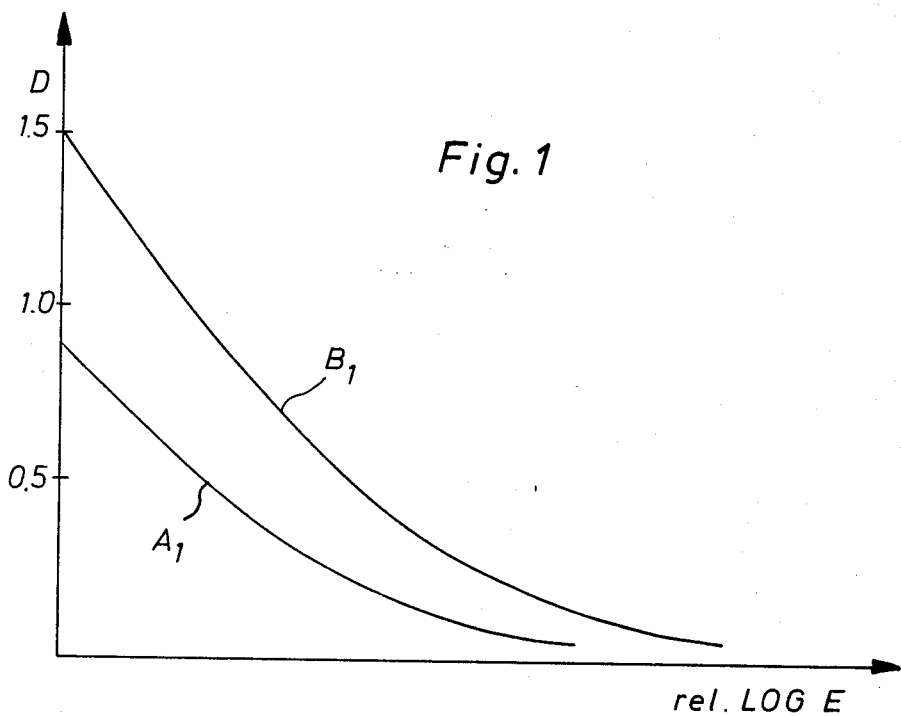

In the maximum density part of the dots or lines of said light distributing means e.g. a contact screen the ratio of the absorption density for the light corresponding with the spectral sensitivity region of the silver halide emulsion layer being during the exposure most remote from the light-distributing means to the absorption density for the light of the whole visible spectrum (400–700 nm) is higher than the said ratio in any other density part of the dots or lines (see FIG. 1).

11 Claims, 4 Drawing Figures

METHOD AND MATERIALS FOR IMPROVING THE COLOR BALANCE OF PHOTOGRAPHIC MULTICOLOR IMAGES USING CONTACT SCREEN

The present invention relates to a method and materials for improving the colour balance of photographic multicolour images.

In the production of colour prints from an assortment of different originals, including e.g. high-contrast transparencies and low contrast opaque colour reflection photographs, with one and the same type of colour print material it is necessary to cover the whole range of desired contrast results.

Such may be done according to a known technique by exposing the photographic material through a screened pattern of light-absorbing material. The use of a screenwise exposure especially with regard to the reproduction of contrasty transparencies on "normal" gradation photographic material has been described in detail in the published German Patent Application (DE-OS) No. 2,445,465 filed by Agfa-Gevaert A.G. on Sept. 24th 1974. According to said DE-OS the contrast-lowering exposure may proceed through a lenticular, gravure or contact screen.

The same technique has been disclosed and illustrated with examples for colour paper and instant print film in Research Disclosure November 1978, item 17533 under the title: "Optical method for curve shape control".

According to said Research Disclosure the contrast and exposure latitude of a colour photographic material are controlled by effecting the imagewise exposure through a screened pattern of light-absorbing material, such as developed silver or filter dye, superimposed upon the photographic material. Detailed control over the final sensitometric results may be achieved by varying the area ratio, density, colour and/or shape of the superimposed pattern e.g. of a contact screen. Hereby on colour printing contrast variations are possible without changing the photographic material or processing compositions. It is possible to selectively lower the contrast of a single emulsion layer of a multilayer photographic colour material by exposing said material through a screen which absorbs the light to which that layer is sensitive.

In usual multicolour photography, multicolour images are formed by superposition of subtractive cyan, magenta and yellow images. A multicolour original may be reproduced through a colour negative-positive process or image reversal process based on the use of differently spectrally sensitized silver halide located in superimposed hydrophilic colloid layers. The superposition of silver halide emulsion layers being differently spectrally sensitive to the primary colours blue, green and red and operating respectively with yellow, magenta and cyan dyes or dye precursors is a characteristic of the subtractive system of multicolour image formation.

Each photographic silver halide emulsion has rarely the same speed and exposure latitude so that it is a serious problem to have the colour rendering of each silver halide emulsion layer in balance to arrive at a multicolour print showing no colour shift or stain. Since a colour print is seen in relation to other objects in the field of view, exceedingly small errors in colour balance are perceptible and objectionable. If the multicolour print contains stain or has a high minimum density, it will not reproduce white objects with enough brightness and the print will appear dark and muddy.

A lack of same speed of the different silver halide emulsion layers having their sensitometric curves (density versus log exposure) parallel rather than matching can be adjusted by adapting the blue, green and red light dosage in the printing exposure using the correct colour filtering.

Not correctable, however, by colour filtering are deviations in colour between the lower and higher densities thus when the sensitometric curves are not parallel but crossing.

In the European Patent Application No. 83200136.6 filed by Agfa-Gevaert N.V. on Jan. 26th 1983 a method of improving the colour balance of a multicolour reversal image has been described wherein a photographic silver halide material capable of yielding a multicolour reversal image of average gradient of at least 1.8 is imagewise exposed to or through a multi-colour continuous tone original while keeping in the optical path between the original and the photographic material a light-distributing means dividing the light in line-like or dot-like portions over the exposed area and said photographic material is reversal processed e.g. by dye diffusion transfer processing, hereby producing a reversal image with average gradient of at most 1.50 and reduced colour point spreading.

As explained in said European Patent Application the use of a contact screen in the exposure yields a better colour balance in multicolour prints produced with a photographic silver halide colour material containing a blue-, a green- and a red-sensitive silver halide emulsion layer that do not have the same speed and exposure latitude.

In connection with a contact screen-exposure technique it has been established experimentally by us that the white light exposure of a photographic multicolour silver halide material containing differently spectrally sensitized silver halide emulsion layers i.e. a blue-, a green- and red-sensitive silver halide emulsion layer through a neutral tone contact screen results in an unequal exposure of these differently spectrally sensitive layers. The light-blocking by the screen dots or lines is not the same for each silver halide emulsion layer in that, the silver halide emulsion layer(s) most remote from the screen receive(s) a higher amount of light than the silver halide emulsion layer in contact with or most close to the screen. Such effect may be due to light-undercutting of the screen dots following from light diffraction at narrow openings.

The practical result from that unequal exposure is an out of balance dye-formation in the photographic material itself or an out of balance dye release and corresponding dye transfer to an image receiving layer when a dye diffusion transfer system is used. Further, it has been established experimentally by us that the exposure of a multicolour reversal processable silver halide emulsion material through a grey wedge and neutral grey dot screen yields a sensitometric wedge print with a rose colour dominant or hue that is particularly outspoken in the toe of the wedge print. When applying a dye diffusion transfer reversal system the rose colour dominant comes from a higher yellow and magenta dye release compared with the cyan dye release from respectively the blue-, green- and red-sensitive silver halide emulsion layer, the blue sensitive layer being the most close to the screen in the exposure and the red-sensitive silver halide emulsion layer being the most remote thereof.

It is one of the objects of the present invention to provide a process for improving the colour balance of a multicolour reversal image obtained in a photographic material itself or obtained by a diffusion transfer reversal process in an image receiving material. By "reversal image" is meant here an image having the same image-values as present in the original used in the imagewise exposure so that the reversal print is actually a negative-to-negative or positive-to-positive image reproduction.

It is another object of the present invention to provide a light-distributing means for use in said process.

It is a further object of the present invention to provide a method for producing such light-distributing means.

Other objects and advantages of the present invention will become apparent from the further description.

The present invention provides a process for the production of a multicolour reversal image with improved colour balance which process comprises the steps of: directing incident image light dot- or linewise modulated by a light-distributing means onto a multicolour photographic silver halide emulsion material containing a blue-, a green- and a red-sensitive silver halide emulsion layer and processing said silver halide emulsion layers to form a colour reversal image, characterized in that in the maximum density part of the dots or lines of said light distributing means the ratio of the absorption density for the light corresponding with the spectral sensitivity region of the silver halide emulsion layer which during the exposure is most remote from the light-distributing means, to the adsorption density for the light of the whole visible spectrum (400–700 nm) is higher than the said ratio in any other density part of the dots or lines.

In the above process the light-distributing means is preferably a contact screen containing dots or lines because its use requires less skill than a glass crossline screen (also called gravure screen) or lenticular screen.

The contact screen normally consists of a transparent resin base and a hydrophilic colloid coating containing vignetted dot or line elements with variable density across each dot or line.

In the conventional grey contact screens the dots consist solely of developed silver because the neutral grey contact screens are normally made by exposure through a crossline screen of a silver halide emulsion layer that is black-and-white developed on a transparent base. A similar technique is used for producing coloured screens as described e.g. in said Research Disclosure item 17533. According to an embodiment colour development is applied and the silver formed is bleached and removed leaving the filter dye screen pattern unaffected.

A contact screen according to the present invention for use in the process of the present invention in conjunction with a photographic multi-silver halide emulsion layer material including a blue-, a green- and a red-sensitive silver halide emulsion layer contains in its dots or lines white light (400–700 nm) absorbing substance(s) and coloured light absorbing substance(s), so that in the maximum density part of said dots or lines the ratio of the absorption density for a selected primary colour light [blue (400–500 nm), green (500–600 nm), or red (600–700)] to the absorption density for said white light is higher than the said ratio in any other density part of said dots or lines. Preferably the maximum colour density is at least 0.3 above the maximum grey (white light) density.

By means of such contact screens the exposure dose of coloured light for the most remote silver halide emulsion layer as defined above of a multilayer photographic material with red-, green- and blue-sensitive silver halide emulsion layers can be reduced under each dot or line directly proportional to the dose of light arriving in said silver halide emulsion layer by the light-undercutting of said dots or lines.

The FIGS. 1 to 4 accompanying the present description contain sensitometric curves relating to the optical density structure of the dots of contact screens used in comparative tests illustrating the invention.

A process for the manufacture of said contact screen for use according to the present invention contains the steps of:

effecting a screen pattern exposure e.g. by projecting a crossline screen onto a silver halide emulsion layer carried by a transparent base, subjecting the thus exposed silver halide emulsion layer to a partial colour development, leaving still developable exposed silver halide, and subjecting the partially colour developed silver halide emulsion layer to a black-and-white development for developing still developable silver halide. The said both developments have been performed preferably in such a way that the maximum colour density is at least 0.3 above the maximum grey (white light) density.

By this process a contact screen used according to the present invention contains in the central part of each dot or line a higher amount of dye than at the edges which can be detected by means of a microdensitometer provided with a colour filter.

The reason why the dots or lines obtain a higher amount of dye in the centre is by virtue of the colour development preceding the black-and-white development. The classical colour developers (p-phenylene diamines) have less reducing power than the common black-and-white developers (e.g. hydroquinone) so that the poorly exposed parts corresponding with the edges of the bell-shaped structure of the screen dots obtain a higher weight ratio of silver to dye than the centre.

Thus, the screen dots or lines of the thus prepared contact screen containing a dye or mixture of dyes and silver have a silver to dye weight ratio lower at the centre of the dots or lines than at their edges.

An other way of producing the screen pattern than by projection exposure through a gravure screen is by dot-wise or line-wise electronically modulated laser beam exposure as described e.g. in the magazine "Der Polygraph" 4-74 pages 196–198 in the article: "Elektronisches Rastern von Farbauszügen" by Uwe Gast.

In the colour development preferably a colour developing solution containing a colour coupler in dissolved form is used. Depending upon the intended application the dye or mixture of dyes produced in the colour development has a major absorption in one of the primary subtractive colours cyan, magenta or yellow.

Indeed, when later on by the use of the contact screen in the contrast reducing exposure of a photographic multicolour silver halide emulsion material the red-sensitive silver halide emulsion layer thereof is most remote from the screen in comparison to the other silver halide emulsion layers a colour coupling agent or mixture of colour coupling agents for cyan is used in the preparation of the screen, which agent(s) form(s) (a) cyan dye(s) absorbing red light e.g. having a main absorption in the red (600–700 nm) part of the visible spectrum and a more or less intensive side absorption in the green (500–600 nm) part of the visible spectrum.

These absorption characteristics of a contact screen used according to the present invention are different from the absorption characteristics of a contact screen wherein the dots consist of filter dye as described in the already mentioned Research Disclosure item 17533. Indeed, in the dots or lines built up by dye alone, although the added main and side absorptions of the dye may be responsible for a certain white light absorption, i.e. a light absorption over the whole visible light spectral range (400–700 nm), the ratio of main and side absorption remains the same over the whole area of each dot or line of the screen, so that the ratio of coloured light and white light absorption remains the same.

The use of a screen having the herein defined optical density structure in its dots or lines in the process of the present invention for modulating the exposure of a reversal image forming photographic multicolour silver halide material reduces effectively the colour hue in the toe of a reversal print and gives the multicolour print over its whole density range (from toe to shoulder) a better colour balance. Under the same circumstances a screen having in its dots or lines a white light and coloured light absorption being the same over the whole area of each dot or line is not that effective but yields a less higher hue than obtained with a neutral grey screen.

When using a contact screen, maximum contrast control is obtained by keeping the screen pattern as near as possible to the silver halide emulsion layer side of the photographic material.

In practice for obtaining the largest tone scale increase the screen profile or pattern is during the exposure in direct contact with the outermost light-sensitive silver halide emulsion layer or its protective layer. Since direct contact of the screen pattern makes it necessary to apply a camera with a vacuum back much of the simplicity of the system would be lost if such direct contact would be obligatory for the obtaining of a practically useful lowering of the gradation in the reversal colour reproduction system operating according to the present invention.

Therefore, control over the final sensitometric results can likewise be achieved by using a contact screen with its screen profile or pattern spaced from the light-sensitive layers e.g. by effecting the exposure with a transparent support layer (thickness 0.01 mm to 0.1 mm) of the screen in contact with the photographic material.

When reproducing an image in the form of an halftone image using a dot screen in the exposure each dot represents a tiny spot incorporating superposed multicolour information which can be analyzed with a colour micro-densitometer yielding the characteristic sensitometric curves for blue, green and red absorption. The human eye integrates the colour information over the whole area of the dot so that in the higher and lower densities of the dot no deviating colour shades are discerned as such.

For strongly improving the colour balance by the present method preferably a contact screen with high screen latitude i.e. high density difference ($\Delta D$) e.g. at least 1.0, preferably 1.0 to 2.0 is used.

In the maximum density part of each dot or line the highest primary colour density is preferably at least 0.3, most preferably 0.3 to 0.6 higher than the highest white light density.

Screen latitude represented by $\Delta D$ is the density difference between the maximum log opacity value and minimum log opacity value of the screen which for a dot sreen is the density difference between the crests of the dots and valleys between the dots.

Contact screens with high density difference allow a considerable contrast lowering even when the screen pattern or profile is kept at a distance from the photographic silver halide material. A varying distance, however, has to be avoided since it results in varying light-undercutting of the profiles which light-undercutting effect for a good colour balance has to be reduced as explained hereinbefore.

The screen period of the screens, i.e. the distance or interval between neighbouring crests of the dots or lines in a screen may be in the range of 140 to 190 μm, i.e. corresponds to about 50 to about 70 lines per cm. It has to be noticed however, that the screen pattern can be uniform, or at random.

The present screen-exposure technique is used in a colour reversal image reproduction system because in that system the present screen light distribution means remedies for the particularly disturbing colour hue in the toe i.e. in the high lights (the whites) of a reversal print. The colour hue appears in the toe of the reversal print when using a conventional neutral grey screen for gradation lowering purposes.

Colour reversal image reproduction systems are well-known to those skilled in the art. A survey of such systems can be found in the book "Imaging Systems" by Kurt I. Jacobson-Ralph E. Jacobson, The Focal Press, London and New York (1976) p. 65–81 and 91–103.

The most conventional production of multicolour reversal prints proceeds by reversal processing using first a black-and-white developer and second after overall exposure or chemical fogging a colour developer and is described e.g. in Neblette's Handbook of Photography and Reprography 7th ed., Van Nostrand Reinhold Company New York (1977) p. 124.

The production of multi-colour reversal images through dye destruction by the silver image formed in a negative working silver halide emulsion layer is described in the above mentioned book: "Imaging Systems" p. 78–81 and the therein cited references.

The production of multi-colour reversal images by imagewise modulated diffusion transfer of dyes or dye providing compounds (dye precursors) from an imagewise exposed and developed photographic silver halide emulsion material into an image-receiving layer can be carried out in a number of ways, as described in said book "Imaging Systems" pages 86–103 and in the book "The Theory of the Photographic Process" 4th ed.—Macmillan Publishing Co., Inc. New York (1977) p. 366–372 and in the published German Patent Application (DE-OS) No. 3,107,540.

The dye diffusion transfer systems operating with photosensitive silver halide are all based on the same principle, viz. the alteration in the mobility of a dye or dye precursor or of a molecule part being a dye or dye precursor is controlled by the image-wise development of silver halide to silver.

According to a first reversal colour imaging system for producing positive colour images by a dye diffusion transfer reversal (DTR-) system negative working silver halide emulsions containing hydroquinone-dye developers are used which developers including the hydroquinone structure have permanently attached thereto a coloured substituent i.e. either a yellow, magenta or cyan coloured substituent for subtractive multicolour image formation.

In the development of the exposed silver halide the hydroquinone-dye developer is oxidized and thereby transformed into a non-ionizable immobile quinone. Unoxidized hydroquinone-dye is transferred by diffusion to a receptor element. Examples of these dye developers and more details about said system are described in U.S. Pat. Nos. 2,983,606 and 3,362,819.

In another embodiment of the production of positive colour images a system of light-sensitive silver halide emulsion layers is used in conjunction with corresponding silver-precipitating layers, which layers contain development nuclei for obtaining therein through the silver complex diffusion transfer reversal process (DTR-process) a silver image and oxidized developing agent capable of reacting with a dye releasing compound for image-wise dye release in correspondence with the non-photoexposed area. Such system is described, e.g., in the published European Patent Application No. 0 003 376.

According to a second colour diffusion transfer system a positive dye image is produced in an image-receiving layer by a dye which is set free image-wise in diffusible state from a negative working silver halide emulsion material by reaction in alkaline conditions of an initially immobile image-dye providing compound with image-wise remaining non-oxidized developing agent. Examples of such system providing in a receptor element positive diffusion transfer dye images with the aid of an image-wise exposed and developed negative working silver halide emulsion material are described, e.g., in the U.S. Pat. Nos. 4,139,379 and 4,139,389 and in the published European Patent Applications Nos. 0 004 399 and 0 038 092.

According to a third system a diffusible dye is released image-wise by reaction of a particular initially immobile image-dye-providing compound with image-wise oxidized developing agent. Examples of such systems providing on development positive diffusion transfer dye images with an image-wise exposed direct-positive working silver halide emulsion material are described, e.g., in the UK Patent Specification No. 1,243,048 corresponding with the German Patent Specification No. 1,772,929, in the U.S. Pat. Nos. 3,227,550 and 3,628,952, and in the published U.S. Ser. No. B 351,673.

The present invention is further illustrated by an embodiment for the manufacture of a contact screen suitable for use according to the present invention.

1. Manufacture of the contact screen

A crossline screen pattern having a screen ruling of 60 lines per mm was projection exposed onto a negative working silver-halide film sheet material GEVATONE N31p (GEVATONE is a registered trade mark of Agfa-Gevaert N.V. Belgium) and was colour developed at 22° C. in a colour developer solution prepared by mixing the following parts A and B.

| Part A | |
|---|---|
| water | 900 ml |
| sodium-sulphite | 4.35 g |
| 2-amino-5-diethylamino-toluene hydrochloride | 2.95 g |
| sodium carbonate | 17.1 g |
| sodium bromide | 1.72 g |
| Part B | |
| 1 g of cyan forming colour coupler: 1-hydroxy-N—phenyl-2-naphthalene-carboxamide dissolved in 25 ml of an aqueous | |

| -continued | |
|---|---|
| 1 N Sodium hydroxide solution. | |

The colour development was carried out for 30 s to 5 min depending on the desired degree of colour density which may vary from 0.8 to 2.0 at the maximum of the absorption.

After the colour development the film sheet was rinsed and further subjected to a black-and-white development at 22° C. applying a developing solution prepared by mixing 1 part of composition BW with 7 parts by volume of demineralized water.

| Composition BW | |
|---|---|
| demineralized water | 300 ml |
| 65% by weight aqueous solution of potassium sulphite | 278 ml |
| potassium metabisulphite | 19.5 g |
| boric acid | 20 g |
| 76.5% by weight aqueous solution of potassium carbonate GV. 1205 | 157 ml |
| hydroquinone | 55 g |
| 1-phenyl-4-methyl-pyrazolidin-3-one | 2.2 g |
| methyl glycol | 100 ml |
| potassium bromide | 24 g |
| demineralized water up to | 1000 ml |

The duration of the black-and-white development was from 30 s to 5 min and yielded screen dots having edges almost solely consisting of silver.

Thereupon the developed sheet material having a transparent resin base was fixed, rinsed and dried.

2. Determination of the ratio of colour density and neutral grey density in a screen dot of the prepared contact screen The above mentioned GEVATONE N31p film sheet material was exposed under the same circumstances as described for the production of the contact screen with the difference, however, that the contact screen was replaced by a grey wedge. The grey wedge exposure simulates a screen dot-exposure because each screen dot represents a concentrical mini-wedge having its highest density in the centre of the dot.

After the exposure the film sheet material was colour developed under the same conditions as described for the manufacture of the contact screen. After the colour development the film sheet material was rinsed and divided into two film strips. One strip was fixed, rinsed and dried and is called strip I.

The other strip was subjected to the black-and-white development described already in the manufacture of the contact screen and is called strip II.

The obtained wedge prints on the strips I and II correspond with sensitometric curves [density (D) versus relative log exposure (rel. log E) values] obtained by measurement with a MACBETH (trade name) Quantalog densitometer provided with a red filter (Wratten filter red No. 25) having a percent transmittance as indicated further on.

In FIG. 1 the sensitometric curves of the measured wedge prints on the film strips I and II are marked $A_1$ and $B_1$ respectively. The curve $A_1$ corresponds with a wedge print obtained after 2 min of the colour development and curve $B_1$ corresponds with the wedge print obtained by said colour development followed by 2 min of the already mentioned black-and-white development.

Figure 2:
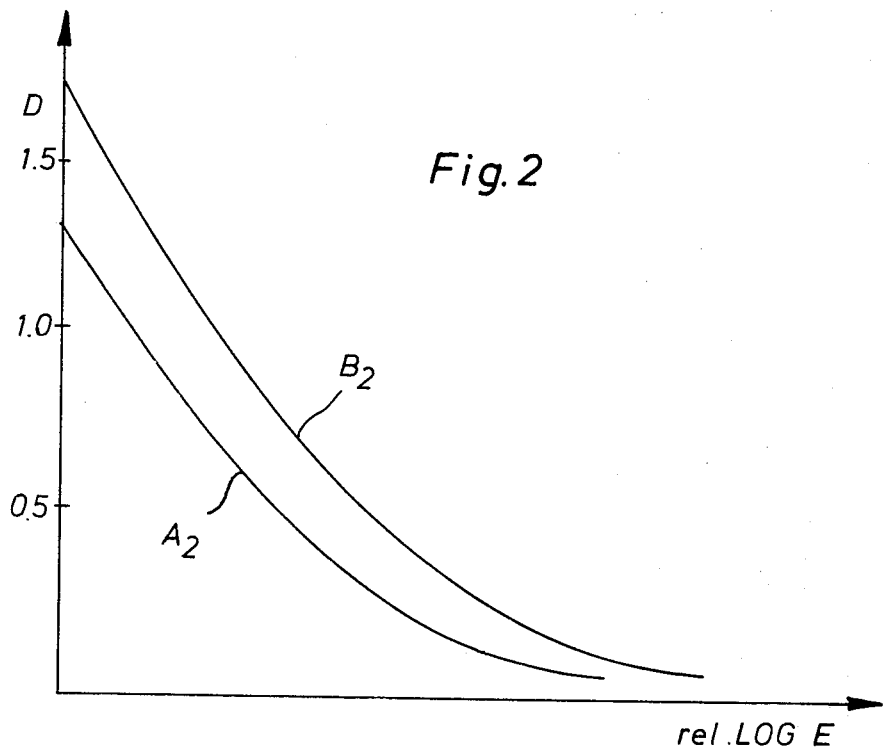

In FIG. 2 the sensitometric curve $A_2$ is the result of a 3 min colour development of the wedge print on film strip I and the sensitometric curve $B_2$ is the result of a 3 min colour development and 4 min black-and-white development of said wedge print on film strip II.

Figure 3:
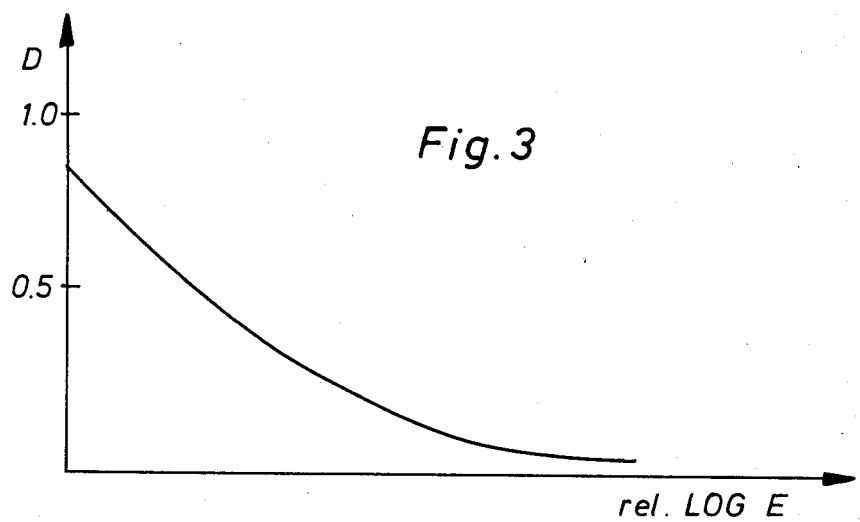

For comparison's sake a same wedge print exposed film strip was solely colour developed and the developed silver retained, i.e. not bleached. The obtained sensitometric curve of that wedge print is represented in FIG. 3. This wedge print simulates a screen dot of a contact screen built up by filter dye and silver in a non-varying proportion from maximum to minimum density of the dots.

By analogy the curve $B_1$ in FIG. 1 represents the sensitometric density versus relative log exposure relationship of the screen dots of the contact screen $S_1$ obtained under the specified colour and black-and-white development conditions of the described $B_1$ wedge production.

From the curve $A_1$ and $B_1$ in FIG. 1 can be learned that the ratio of the density portion resulting from the colour development and the density portion resulting from the colour development plus black-and-white development is the highest at the maximum density of the dot and diminishes gradually towards its minimum density. Such screen $S_1$ and its use is within the scope of the present invention. The same applies to the contact screen $S_2$ having a screen dot density structure corresponding to curve $B_2$ of FIG. 2.

By analogy FIG. 3 represents the sensitometric density versus relative log exposure relationship of screen dots of a contact screen $S_3$ containing in each screen dot a cyan dye and silver not varying in proportion over the area of the dot and hereby belonging to the prior art of dye developed screens.

In the following Example the contact screens having screen dots in accordance with the sensitometric characteristics illustrated in FIGS. 1, 2 and 3 and a pure silver dot contact screen $S_4$ of the same ruling as the dye containing screens and having in its dots a density pattern as given by the curve in FIG. 4 were used in a contact exposure in combination with a grey wedge to define the influence of the screens on the colour balance of a printed wedge obtained in an image receiving material by a multicolour dye diffusion transfer reversal material operating according to the principles of the published European Patent Application 0 004 399.

EXAMPLE

Composition of Light-Sensitive Material

A subbed water-resistant paper support consisting of a paper sheet of 110 g/sq.m coated at both sides with a polyethylene stratum of 15 g/sq.m was treated with a corona discharge and thereupon coated in the mentioned order with the following layers, the amounts relating to 1 sq.m of material:

(1) a red-sensitive silver chloride emulsion layer incorporating an amount of silver halide corresponding with 0.5 g of silver, 2 g of gelatin, 0.25 g of ditert-octylhydroquinone and 0.35 g of the cyan quinone compound C of the Table 1 hereinafter;

(2) a magenta filter layer containing 2 g of gelatin, 1 g of Pigment Red 146 (Colour Index No. 11,000) sold under the trade name Colanyl Carmin FBB 31 by Farbwerke Hoechst AG, W. Germany and 0.15 g of octadecylhydroquinonesulphonic acid;

(3) a green-sensitive silver chloride emulsion layer incorporating an amount of silver halide corresponding with 0.5 g of silver, 2 g of gelatin, 0.25 g of ditert-octylhydroquinone and 0.35 g of the magenta quinone compound M of the Table 1 hereinafter;

(4) a yellow filter layer containing 2 g of gelatin, 1 g of Pigment Yellow 83 (Colour Index No. 20,000) sold under the trade name Permanentgelb HR Colanyl Teig by Farbwerke Hoechst AG, W. Germany, 0.15 g of octadecylhydroquinonesulphonic acid and 0.15 g of 1-phenyl-4-methyl-3-pyrazolidinone;

(5) a blue-sensitive silver chloride emulsion layer incorporating an amount of silver halide corresponding with 0.7 g of silver, 2 g of gelatin, 0.5 g of ditert-octylhydroquinone and 0.5 g of the yellow quinone compound Y of the Table 1 hereinafter;

(6) a protective layer containing 1.5 g of gelatin and 0.15 g of 1-phenyl-4-methyl-3-pyrazolidinone.

TABLE 1

Y. 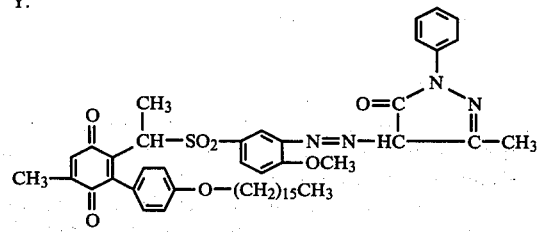

M. 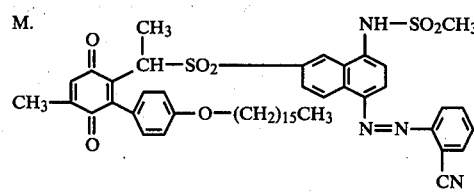

C. 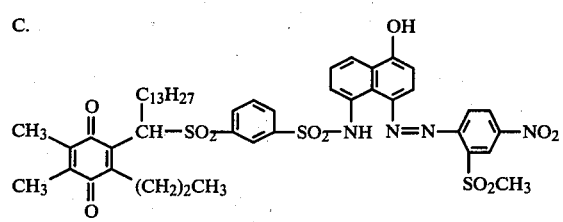

Exposure A

A sheet A of the obtained photographic material was exposed reflectographically in a REPROMASTER [trade name of OCE HELIOPRINT (Denmark)] type 2001 to a silver achromatic (grey) step wedge of constant 0.1 and through the contacting dot-contact screen $S_1$ having screen dots following the sensitometry of curve $B_1$ in FIG. 1, and a dot frequency of 60 lines per cm.

Exposure B

A sheet B of the same photographic material as obtained above was exposed as sheet A with the difference however, that screen $S_1$ was replaced by screen $S_2$ having screen dots following the sensitometry of curve $B_2$ in FIG. 2.

Exposure C

A sheet C of the same photographic material as obtained above was exposed as sheet A with the difference however, that screen S₁ was replaced by screen S₃ having screen dots following the sensitometry of FIG. 3.

Exposure D

Figure 4:
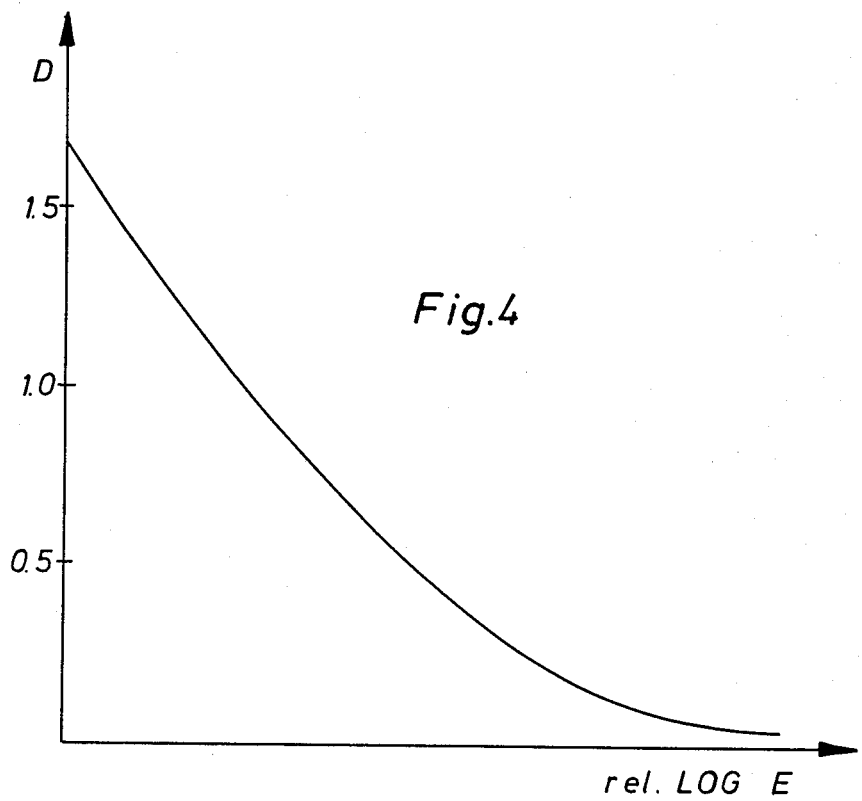

A sheet D of the same photographic material as obtained above was exposed as sheet A with the difference however, that screen S₁ was replaced by screen S₄ wherein the screen dots solely contain black silver and have according to FIG. 4 a white light absorption with maximum dot density 1.7 and follow a density course practically identical to that of curve B₂ of FIG. 2.

After their exposure the sheets A, B, C, D were each contacted at 22° C. with an image receiving material as described hereinafter which material was pressed against these sheet materials after wetting them in the COPYPROOF CP 38 (trade name) diffusion transfer processing apparatus containing in its tray an aqueous solution comprising per liter: 25 g of sodium hydroxide, 2 g of sodium thiosulphate, 1 g of potassium bromide and 80 g of cyclohexane dimethanol.

After a contact time of 1 minute the receptor materials and light-sensitive materials were peeled apart, washed and dried. In the receptor material a positive multidye wedge image of the original achromatic silver wedge was obtained.

Composition of the image receiving material

To the same support as described for the above light-sensitive material a coating having the following composition was applied per sq.m.:

| | |
|---|---|
| gelatin | 5 g |
| triphenyl-n-hexadecylphosphonium bromide | 2 g |

Evaluation of the colour balance

In the wedge images obtained in the image receiving materials A, B, C and D processed with the light-sensitive materials A, B, C and D respectively the first ten steps were subjected to primary colour density measurements with the MACBETH Quantalog densitometer type RD-100 R provided for the primary colour measurements with a blue, green and red filter respectively. The blue filter was a Wratten filter blue No. 47. The green filter was a Wratten filter green No. 58.

The red filter was a Wratten filter red No. 25 which has a percent transmittance as represented on page E-218 of the Handbook of Chemistry and Physics, 52nd Edition, Editor Robert C. Weast—CRC Press 18901 Cranwood Parkway, Cleveland, Ohio 44128, U.S.A.

The above Wratten filter Green No. 58 has a percent transmittance as represented also on page E-219 of said Handbook.

The above Wratten filter Blue No. 47 has a percent transmittance as represented also on page E-219 of said Handbook.

The resulting density values are listed in the following Table 2.

TABLE 2

| Exposure | Primary colour | Density values (× 100) of steps | | | | | | | | | |
|---|---|---|---|---|---|---|---|---|---|---|---|
| | | 1 | 2 | 3 | 4 | 5 | 6 | 7 | 8 | 9 | 10 |
| A | blue | 15 | 17 | 19 | 24 | 31 | 37 | 45 | 54 | 64 | 76 |
| | green | 14 | 16 | 18 | 22 | 30 | 36 | 44 | 53 | 64 | 76 |
| | red | 14 | 16 | 18 | 23 | 30 | 38 | 46 | 55 | 66 | 76 |
| B | blue | 14 | 16 | 21 | 25 | 32 | 36 | 41 | 48 | 55 | 62 |
| | geen | 14 | 17 | 21 | 26 | 32 | 36 | 42 | 49 | 55 | 64 |
| | red | 14 | 16 | 21 | 26 | 32 | 37 | 43 | 50 | 56 | 63 |

TABLE 2-continued

| Exposure | Primary colour | Density values (× 100) of steps | | | | | | | | | |
|---|---|---|---|---|---|---|---|---|---|---|---|
| | | 1 | 2 | 3 | 4 | 5 | 6 | 7 | 8 | 9 | 10 |
| C | blue | 12 | 14 | 16 | 19 | 26 | 35 | 44 | 55 | 67 | 77 |
| | green | 12 | 14 | 17 | 21 | 29 | 39 | 50 | 61 | 75 | 86 |
| | red | 12 | 15 | 19 | 23 | 31 | 38 | 48 | 56 | 67 | 75 |
| D | blue | 19 | 23 | 26 | 32 | 37 | 44 | 50 | 59 | 69 | 88 |
| | green | 20 | 24 | 28 | 34 | 39 | 47 | 55 | 64 | 75 | 98 |
| | red | 15 | 18 | 22 | 30 | 36 | 45 | 53 | 64 | 75 | 99 |

From these density values but still better by visual inspection of the obtained wedge the conclusion is drawn that the colour balance of the grey wedges obtained by exposures A and B through contact screens S₁ and S₂ according to the present invention is better than obtained with the coloured contact screen S₃ and neutral grey contact screen S₄ as defined.

We claim:

1. A process for the production of a multicolour reversal image with improved colour balance which process comprises the steps of directing incident image light dot- or linewise modulated by a contact screen onto a multicolour photographic silver halide emulsion material containing a blue-, a green- and a red-sensitive silver halide emulsion layer and processing said silver halide emulsion layers to form a colour reversal image, characterized in that in the maximum density part of the dots or lines of said contact screen the ratio of the absorption density for the light corresponding with the spectral sensitivity region of the silver halide emulsion layer which during the exposure is most remote from the contact screen to the absorption density for the light of the whole visible spectrum (400–700 nm) is higher than the said ratio in any other density part of the dots or lines.

2. Process according to claim 1, characterized in that the contact screen contains in its dots or lines white light (400–700 nm) absorbing substance(s) and coloured light absorbing substance(s), so that in the maximum density part of said dots or lines the ratio of the absorption density for a selected primary colour light [blue (400–500 nm), green (500–600 nm) or red (600–700 nm)] to the absorption density for said white light is higher than the said ratio in any other density part of said dots or lines.

3. Process according to claim 1, characterized in that the contact screen contains in the central part of each dot or line a higher amount of dye or mixture of dyes than at the edges, said dye or mixture of dyes having a major absorption in one of the primary subtractive colours cyan, magenta or yellow.

4. Process according to claim 1, characterized in that in the multicolour photographic silver halide emulsion material in comparison to the other silver halide emulsion layers the red-sensitive silver halide emulsion layer is most remote from the contact screen during its exposure and the contact screen contains in its dots or lines a cyan dye absorbing red light.

5. Process according to claim 1, characterized in that the maximum density of the screen dots or lines is at least 1.0.

6. Process according to claim 1, characterized in that in the maximum density part of each dot or line primary colour absorption is at least 0.3 higher than the white lignt absorption density.

7. Process according to claim 1, characterized in that the screen latitude being the density difference between the maximum log opacity value and minimum log opacity value of the contact screen is 1.0 to 2.0.

8. Process according to any of claim 1, characterized in that the screen dots or lines of the contact screen contain a dye or mixture of dyes and silver with a silver to dye weight ratio lower at the centre of the dots or lines than at their edges.

9. Process according to claim 1, characterized in that the contact screen is manufactured by a process containing the steps of:
- effecting a screen pattern exposure onto a silver halide emulsion layer carried by a transparent base,
- subjecting the thus exposed silver halide emulsion layer to a partial colour development leaving still developable exposed silver halide, and
- subjecting the partially colour developed silver halide emulsion layer to a black-and-white development for developing still developable silver halide.

10. Process according to claim 1, characterized in that the screen pattern of the contact screen during the exposure is in direct contact with the outermost light-sensitive silver halide emulsion layer or its protective layer of said multicolour photographic silver halide emulsion material.

11. Process according to claim 1, characterized in that the production of the multicolour reversal image proceeds by imagewise modulated diffusion transfer of dyes or dye providing compounds from said multicolour photographic silver halide emulsion material into an image-receiving layer.

* * * * *